(12) United States Patent
Otsuka et al.

(10) Patent No.: US 9,679,795 B2
(45) Date of Patent: Jun. 13, 2017

(54) ARTICLE STORAGE FACILITY

(71) Applicant: Daifuku Co., Ltd., Osaka-shi (JP)

(72) Inventors: Hiroshi Otsuka, Gamo-gun (JP);
Shinsuke Kawamura, Gamo-gun (JP);
Tadahiro Yoshimoto, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 273 days.

(21) Appl. No.: 14/310,233

(22) Filed: Jun. 20, 2014

(65) Prior Publication Data

US 2015/0000765 A1    Jan. 1, 2015

(30) Foreign Application Priority Data

Jun. 26, 2013  (JP) ................................. 2013-134267

(51) Int. Cl.
*H01L 21/677*  (2006.01)
*H01L 21/673*  (2006.01)

(52) U.S. Cl.
CPC .. *H01L 21/67769* (2013.01); *H01L 21/67389* (2013.01); *H01L 21/67393* (2013.01); *B65G 2201/0297* (2013.01); *Y10T 137/6966* (2015.04)

(58) Field of Classification Search
CPC ....... Y10T 137/87249; H01L 21/67769; H01L 21/67389; H01L 21/67393; B65G 2201/0297
USPC ................. 137/597, 599.01, 599.03, 599.04; 141/59, 66
See application file for complete search history.

(56) References Cited

U.S. PATENT DOCUMENTS

| | | | |
|---|---|---|---|
| 5,378,283 A * | 1/1995 | Ushikawa | C23C 16/4401 118/715 |
| 6,123,120 A | 9/2000 | Yotsumoto et al. | |
| 6,126,994 A * | 10/2000 | Murakami | C23C 16/4481 134/21 |
| 2005/0074313 A1* | 4/2005 | Kang | H01L 21/67772 414/222.01 |
| 2006/0176928 A1* | 8/2006 | Nakamura | H01L 21/6719 373/60 |
| 2006/0280867 A1* | 12/2006 | Park | C23C 16/34 427/248.1 |

(Continued)

FOREIGN PATENT DOCUMENTS

| | | |
|---|---|---|
| JP | H11168135 A | 6/1999 |
| JP | 20065193 A | 1/2006 |
| JP | 2010182747 A | 8/2010 |

*Primary Examiner* — John K Fristoe, Jr.
*Assistant Examiner* — Josephine Trinidad-Borges
(74) *Attorney, Agent, or Firm* — The Webb Law Firm

(57) ABSTRACT

An article storage facility is provided which is relatively simple in structure and in which it is easier to perform maintenance work of apparatus provided to each zone. A first switching valve is provided in each of a plurality of zone gas supply portions whereas a second switching valve is provided in each of a plurality of storage section gas supply portions. A plurality of relief passages is provided with each relief passage connected to the inactive gas supply passage on a downstream side, with respect to a gas supplying direction, of the position in which the first switching valve is provided and on an upstream side, with respect to the gas supplying direction, of the position in which the second switching valve is provided in the inactive gas supply passage. A zone relief switching valve is provided to each of the plurality of relief passages.

8 Claims, 7 Drawing Sheets

(56) References Cited

U.S. PATENT DOCUMENTS

| | | | |
|---|---|---|---|
| 2008/0156069 A1* | 7/2008 | Murata | G01D 21/00 73/19.04 |
| 2009/0232986 A1* | 9/2009 | Choi | C23C 16/45561 427/255.28 |
| 2012/0266984 A1* | 10/2012 | Josephson | G05D 7/0641 137/561 R |

* cited by examiner

ARTICLE STORAGE FACILITY

CROSS-REFERENCE TO RELATED APPLICATION

This application claims priority to Japanese Patent Application No. 2013-134267 filed Jun. 26, 2013, the disclosure of which is hereby incorporated in its entirety by reference.

FIELD OF THE INVENTION

The present invention relates to an article storage facility comprising a plurality of storage sections for storing containers, an inactive gas supply passage for supplying inactive gas to each of the plurality of storage sections, inject portions, each of which is configured to inject the inactive gas supplied to an associated one of the storage sections by the inactive gas supply passage into inside an associated one of the containers stored in the associated one of the storage sections wherein the plurality of storage sections are divided into a plurality of zones.

BACKGROUND

An example of an article storage facility such as one described above is disclosed in JP Publication of Application No. H11-168135 (Patent Document 1). The article storage facility of Patent Document 1 includes a plurality of storage sections for storing containers, and inactive gas supply passages which supply inactive gas, such as nitrogen gas and gaseous argon, to each of the plurality of storage sections, and is configured to supply inactive gas to inject portions through inactive gas supply passages, and to inject inactive gas from the inject portion to supply inactive gas to within each of the containers stored in the storage sections.

In the article storage facility of Patent Document 1 described above, inactive gas is supplied to a container when the container is stored in a storage section. This causes oxygen gas and vapor, etc., which are disadvantageous in terms of controlling quality of the semiconductor substrates, to be discharged out of the container, thus reducing the occurrences of any defects such as oxidization etc. of the semiconductor substrates stored in the container.

Thus, article storage facilities are known in which attempts are made to prevent degradation in the quality of the articles in containers by supplying inactive gas to the containers stored in the storage sections.

SUMMARY OF THE INVENTION

Six storage sections are provided in the article storage facility of Patent Document 1 described above. And the six storage sections are divided into two zones. And an inactive gas supply passage is provided individually to each of the two zones. Thus, a supply source of inactive gas is provided to each of the two inactive gas supply passages. And thus, the two supply sources supply inactive gas to respective ones of the inactive gas supply passages.

In such an article storage facility, it is conceivable to attempt to reduce the number of supply sources, thus to simplify the structure of the article storage facility, by connecting each of the two inactive gas supply passages to a common base gas supply portion to supply inactive gas from a single gas supply source to the storage sections belonging to the two zones.

When an article storage facility is configured as described above, and when, for example, a failure occurs in one of the main valves 21 with one provided to each zone and that main valve 21 needs to be replaced, it is necessary to stop supplying the inactive gas to the inactive gas supply passage and to cause a part of the inactive gas that remains under pressure in the inactive gas supply passage, in which the main valve 21 is provided, to be discharged to the outside to equalize the pressure in the inactive gas supply passage with the external pressure (venting of pressure, or pressure venting). However, since the inactive gas supply passages are both connected to the common base gas supply portion, supplying of inactive gas to both passages is stopped if the supplying of the inactive gas to the base gas supply portion is stopped in order to stop the supplying of inactive gas. As a result, the supplying of the inactive gas to all of the storage sections of the article storage facility is stopped. Thus, it is necessary to stop supplying the inactive gas to all of the storage sections in the article storage facility even when replacing one of the pieces of apparatus with one piece provided to each zone.

In addition, there is a possibility that impurities may have entered the inactive gas supply passage during the replacement of the apparatus described above. Thus, inactive gas needs to be made to flow through the inactive gas supply passage before operation is resumed, and thus to perform a preliminary operation for discharging any impurities to the outside with the inactive gas. During this process, if the inactive gas that has flown through the inactive gas supply passage is allowed to be injected from an inject portion, and if a container is stored in the storage section, then there is a possibility that impurities may enter the container with the inactive gas discharged from the inject portion. Thus, it is necessary to remove containers from the storage sections when performing preliminary operation. And thus there is a problem that a preparation for the preliminary operation requires a lot of efforts.

Thus, although an article storage facility can have a simple structure when the article storage facility is configured as described above, when a piece of apparatus is provided to each zone and one of these pieces of apparatus needs to be replaced, the zones, other than the zone in which the apparatus in question is provided, are also affected; thus it is difficult to perform maintenance work on the apparatus.

In light of the background described above, an article storage facility is desired which is relatively simple is structure and in which it is easier to perform maintenance work of apparatus provided to each zone.

An article storage facility in accordance with the present invention comprises:

a plurality of storage sections for storing containers; an inactive gas supply passage for supplying inactive gas to each of the plurality of storage sections; inject portions, each of which is configured to inject the inactive gas supplied to an associated one of the storage sections by the inactive gas supply passage into inside an associated one of the containers stored in the associated one of the storage sections; wherein the plurality of storage sections are divided into a plurality of zones, wherein the inactive gas supply passage includes a base gas supply portion, a plurality of zone gas supply portions each of which branches off from the base gas supply portion to associated one of the plurality of zones to supply the inactive gas which flows through the base gas supply portion to the associated one of the plurality of zones, a plurality of storage section gas supply portions each of which is configured to supply the inactive gas which flows through a corresponding zone gas supply portion individually to associated one of the plurality of storage sections that belong to the zone that corresponds to the corresponding zone gas supply portion, and is configured to allow the inactive gas to be injected from associated one of the inject portions, wherein the article storage facility further comprises:

a first switching valve which is provided to each of the plurality of zone gas supply portions, and which can be switched between an open state in which the inactive gas is allowed to flow through the first switching valve and an closed state in which the inactive gas is prevented from flowing through the first switching valve;

a second switching valve provided in either (a) each of the plurality of zone gas supply portions, on a downstream side, with respect to a gas supplying direction, of a position in which the first switching valve is provided, or (b) each of the plurality of storage section gas supply portions, wherein the second switching valve can be switched between an open state in which the inactive gas is allowed to flow through the second switching valve and an closed state in which the inactive gas is prevented from flowing through the second switching valve; and a plurality of relief passages connected to respective ones of the plurality of zone gas supply portions for discharging inactive gas from the respective ones of the zone gas supply portions;

wherein each of the plurality of relief passages is connected to the inactive gas supply passage on the downstream side, with respect to the gas supplying direction, of a position in which the first switching valve is provided in the inactive gas supply passage and on the upstream side, with respect to the gas supplying direction, of a position in which the second switching valve is provided, and wherein each of the plurality of relief passages is provided with a zone relief switching valve which can be switched between an open state in which inactive gas is allowed to flow through the zone relief switching valve, and a closed state in which inactive gas is prevented from flowing through the zone relief switching valve.

With the arrangement described above, the inactive gas supply passage supplies inactive gas from the base gas supply portion to each of the plurality of zones through corresponding one of the plurality of zone gas supply portions. And each zone gas supply portion supplies inactive gas which flows through the zone gas supply portion to each of the plurality of storage sections individually through the corresponding one of the plurality of storage section gas supply portions. Since arrangement allows one inactive gas supply passage to supply inactive gas to each of the plurality of storage sections which belong to the plurality of zones, the structure of the article storage facility can be made simpler compared with a case where a separate inactive gas supply passage is provided to each to a plurality of zones.

And each zone gas supply portion is provided with the first switching valve whereas each of the zone gas supply portions or each of the plurality of storage section gas supply portions is provided with the second switching valve.

Thus, switching can be accomplished for each zone between a state in which inactive gas is supplied to the storage sections and a state in which inactive gas is not supplied to the storage sections, by switching, between the closed state and the open state, the first switching valve and the second switching valve provided in a zone gas supply portion, or the second switching valve provided in each of the plurality of storage section gas supply portions.

Each relief passages is connected to a portion (referred to as a target portion of a zone) of the inactive gas supply passage on the downstream side, with respect to the gas supplying direction, of the position in which the first switching valve is provided and on the upstream side, with respect to the gas supplying direction, of the position in which the second switching valve is provided. Thus, by switching the first switching valve and the second switching valve to the closed state, and by switching the zone relief switching valve to the open state, the supplying of inactive gas to the storage sections in any given zone can be stopped, and inactive gas that remains in the target portion of the zone can be discharged through a relief passage to perform pressure venting only of the target portion of a particular zone.

Thus, when replacing a piece of apparatus located in the target portion of a zone, supplying of inactive gas to the relevant zone can be stopped and pressure venting can be performed for that zone while allowing uninterrupted supplying of inactive gas to other zones.

In addition, by switching the first switching valve and the zone relief switching valve to the open state, and by switching the second switching valve to the closed state, inactive gas supplied to the target portion of the zone from the base gas supply portion can be discharged from a relief passage. Thus, for example, when one of the pieces of apparatus with each piece provided to each zone has been replaced, and when performing the preliminary operation for discharging any impurities to the outside with inactive gas by causing inactive gas to flow through the target portion of the zone in the inactive gas supply passage before resuming the operation in order to remove any impurities that may have entered during the replacement, any impurities are prevented from entering the container with inactive gas injected through the inject portion because inactive gas is not injected into the container from the inject portion. As a result, it is not necessary to remove the containers stored in the storage sections during the preliminary operation, etc., which reduces the amount of efforts that go into the preparation for the operation.

Thus, the structure of the article storage facility can be simplified and any adverse effects on the zones other than the zone in which the apparatus in question is provided can be reduced when replacing one of the pieces of the apparatus with each piece provided to each zone; thus, it is easier to perform maintenance work such as replacement of apparatus.

Examples of preferred embodiments of the present invention are described next.

In an embodiment of the article storage facility in accordance with the present invention, walls are preferably provided to enclose installation space in which the plurality of storage sections are installed, wherein the zone relief switching valve is preferably located outside the walls, and is preferably a manually operated switching valve which can be switched between the open state and the closed state by manual operation.

With the arrangement described above, a worker can switch the zone relief switching valve to the open state to cause inactive gas supplied to the zone gas supply portion to be discharge from the relief passage to take a sample of the inactive gas which is flowing through the zone gas supply portion.

Also, the installation space may be at times filled with the inactive gas discharged from the containers. Even in such cases, with the zone relief switching valves provided outside the walls, the worker can operate the zone relief switching valves without entering the installation space.

In an embodiment of the article storage facility in accordance with the present invention, a merged relief passage connected to each of the plurality of relief passages at a location on a downstream side, with respect to the gas discharge direction, of a position in which the zone relief switching valve is preferably provided in each of the plurality of relief passages, wherein a merged relief switching valve is preferably provided in the merged relief passage wherein the merged relief switching valve can be switched by manual operation between an open state in which inactive gas is allowed to flow through the merged relief switching valve and a closed state in which inactive gas is prevented from flowing through the merged relief switching valve, and wherein the merged relief switching valve is preferably located outside the walls.

With the arrangement described above, a worker can operate the zone relief switching valves and the merged relief switching valve without entering the installation space. And by switching the zone relief switching valves and the merged relief switching valve to the open state, inactive gas can be discharged for each zone.

And the zone relief switching valves and the merged relief switching valve provide redundancy in providing the manually operated switching valve. Because discharging of inactive gas can be stopped by switching at least one of the two switching valves to the closed state, incidents of inadvertent discharging of inactive gas caused by a worker forgetting to close the switching valve can be reduced In an embodiment of the article storage facility in accordance with the present invention, a base portion relief passage which is connected to the base gas supply portion is provided, and wherein the base portion relief passage is preferably provided with a base portion relief switching valve which can be switched between an open state in which inactive gas is allowed to flow through the base portion relief switching valve, and a closed state in which inactive gas is prevented from flowing through the base portion relief switching valve.

With the arrangement described above, a worker can switch the base portion relief switching valve to the open state to cause inactive gas supplied to the base gas supply portion to be discharge from the base portion relief passage to take a sample of the inactive gas which is flowing through the base gas supply portion.

And a determination can be made as to whether a contaminating source is in the base gas supply portion or in a zone gas supply portion based on the detection results of the sample of inactive gas discharged from the relief passage provided for each zone, and on the detection results of the sample of inactive gas discharged from the base portion relief passage. Thus information which is advantageous in identifying the contaminating source can be obtained.

DETAILED DESCRIPTION

The embodiment of the present invention is described next with reference to the drawings.

(Overall Structure)

Figure 1:
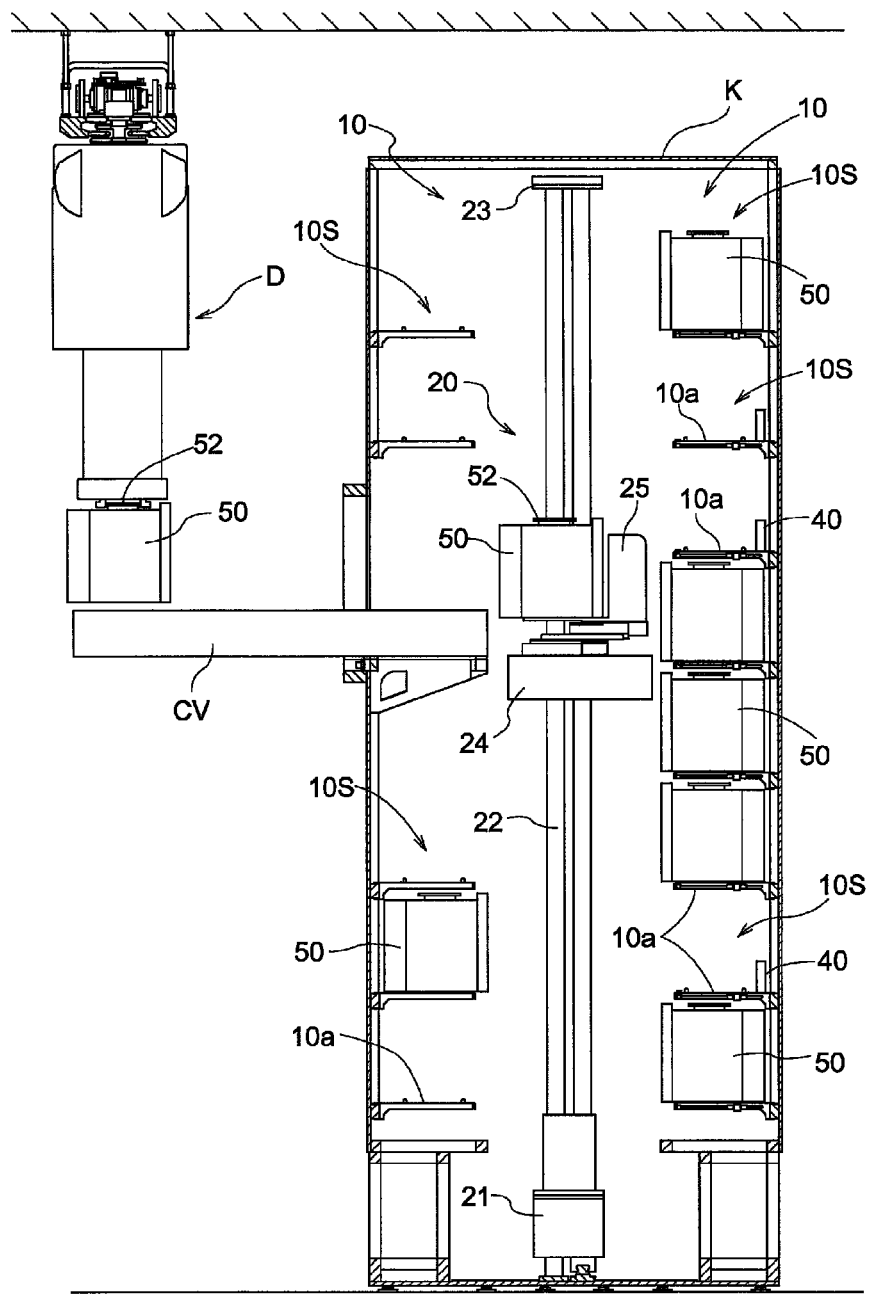
FIG. 1 is a vertical sectional side view of an article storage facility.

As shown in FIG. 1, the article storage facility includes a storage rack 10 having a plurality of storage sections 10S each of which is configured to store a container 50, a stacker crane 20 which transports the containers 50 one at a time, walls K which cover the installation space in which the storage racks 10 (including the plurality of storage sections 10S) and the stacker crane 20 are provided, and a carry in and out conveyor CV which extends through one of the walls K and which supports and transports the containers 50.

Note that a pair of storage racks 10 are provided such that they face each other. Also, in the present embodiment, each storage rack 10 stores FOUPs (Front Opening Unified Pod), which function as the containers 50, each of which holds or stores semiconductor substrates W (referred to hereinafter as substrates W).

(Structure of the Container 50)

Figure 4:
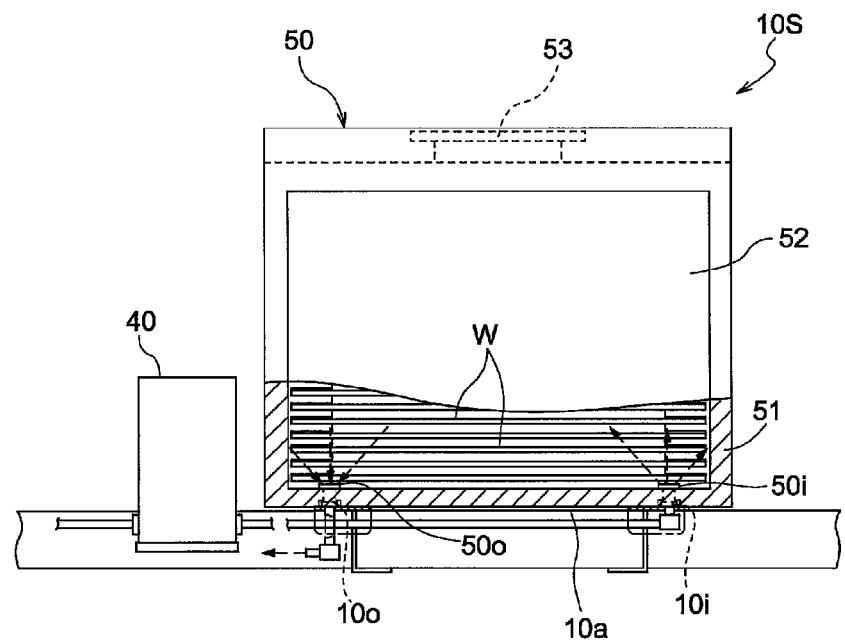
FIG. 4 is a front view of the storage section.
Figure 4:
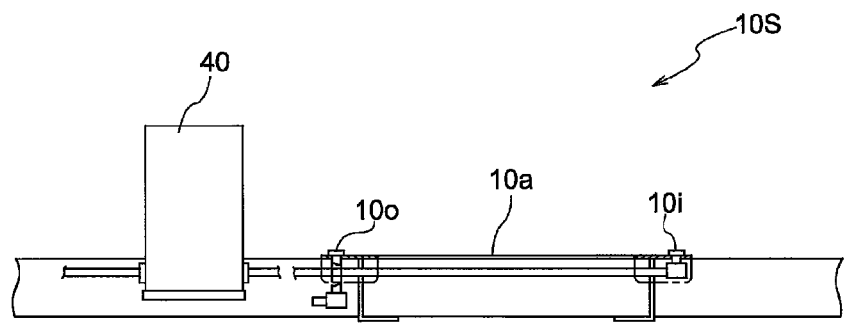

As shown in FIG. 4, each container 50 includes a casing 51 having an opening for inserting and retrieving the substrates W, and a detachable lid 52 which closes the opening of the casing 51 when attached to the casing 51.

Figure 2:
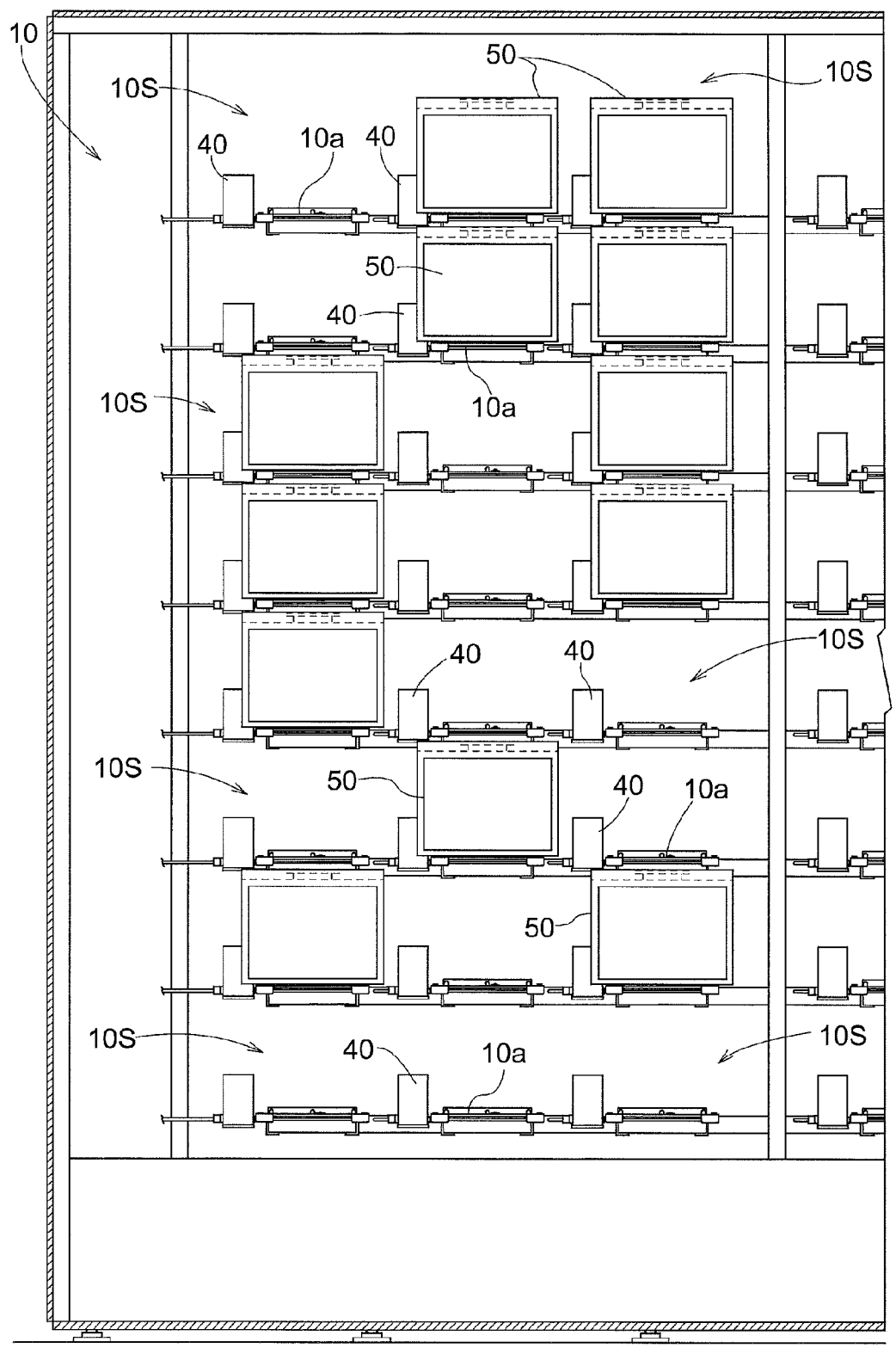
FIG. 2 is a vertical sectional front view showing a part of the facility.

As shown in FIGS. 1, 2, and 4, a top flange 53, configured to be gripped by a hoist type transport vehicle D, is formed in the top surface of the casing 51. In addition, a gas supply opening 50*i* for introducing or injecting nitrogen gas, which functions as inactive gas, into the container 50, as well as a discharge opening 50*o* for discharging nitrogen gas out of the container 50 are formed in the bottom surface of the casing 51. While not shown, the gas supply opening 50*i* is provided with an introducing side opening and closing valve whereas the discharge opening 50*o* is provided with a discharging side opening and closing valve.

Thus, the container 50 is configured to gain and maintain its airtightness by closing the opening by means of the lid 52 with the substrates W stored within the container 50, and by closing each of the gas supply opening 50*i* and the discharge opening 50*o* with respective opening and closing valves.

The introducing side opening and closing valve of the gas supply opening 50*i* is urged in a valve closing direction, or toward its closed position, by an urging member, such as a spring. And when the inject pressure of the nitrogen gas supplied to the gas supply opening 50*i* becomes greater than or equal to a set valve opening pressure which is set to be a value greater than the atmospheric pressure, the introducing side opening and closing valve of the gas supply opening 50*i* is opened by that inject pressure.

Also, the discharging side opening and closing valve of the discharge opening 50*o* is urged in a valve closing direction, or toward its closed position, by an urging member, such as a spring. And when the pressure inside the container 50 becomes greater than or equal to a set valve opening pressure which is set to be a value greater than the atmospheric pressure, the discharge side opening and closing valve of the discharge opening 50*o* is opened by that pressure.

(Structure of the Stacker Crane 20)

As shown in FIG. 1, the stacker crane 20 includes a travel carriage 21 which is configured to travel on the front side of the storage rack 10 and along a rack lateral width direction of the storage rack 10, a mast 22 provided to stand vertically on the travel carriage 21, an upper frame 23 which is provided in an upper end of the mast 22 and which engages with an upper guide rail (not shown), and a vertically movable platform 24 which can be moved vertically, or up and down, while being guided by the mast 22.

A transfer device 25 for transferring the container 50 to or from a storage section 10S and to or from the carry in and out conveyor CV is mounted on the vertically movable platform 24. And the stacker crane 20 is configured to perform a carry in operation for transporting a container 50 on the carry in and out conveyor CV to a storage section 10S, a carry out operation for transporting a container 50 stored in a storage section 10S to the carry in and out conveyor CV, and a relocating operation for transporting a container 50 in a storage section 10S to another storage section 10S, by performing a traveling operation of the travel carriage 21, a raising and lowering operation of the vertically movable platform 24 and a transfer operation of the transfer device 25.

(Structure of the Storage Sections 10S)

As shown in FIG. 2, a plurality of storage sections 10S in the storage rack 10 are arranged both in the vertical direction and in the rack lateral width direction. To describe the storage rack 10 in more detail, in the present embodiment, eight horizontal rows of storage sections 10S are arranged with one located above another in the vertical direction, and nine vertical columns (of which only four columns are shown in FIG. 2) are arranged with one located next to another in the rack lateral width direction in the storage rack 10. Accordingly, a total of 72 storage sections 10S are provided in each of the storage racks 10.

Figure 5:
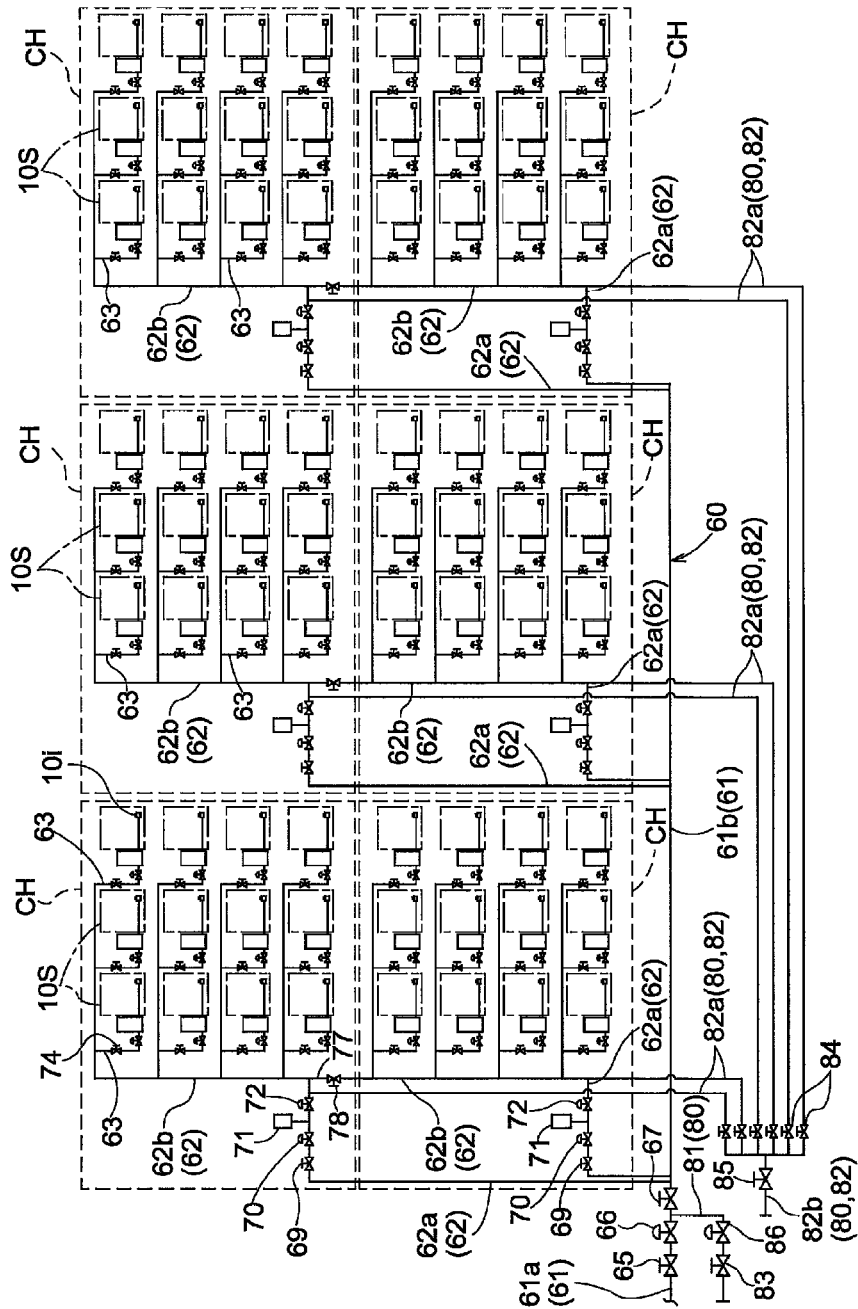
FIG. 5 shows how inactive gas is supplied to different zones.

And as shown in FIG. 5, a total of 12 storage sections 10S located at 12 locations within four horizontal rows arranged with one located on top of another in the vertical direction, and three vertical columns arranged with one located next to another in the rack lateral width direction are designated to belong to each zone CH so that the 72 storage sections 10S are divided into groups such that each storage section 10S belongs to one of the six zones CH. Thus, the plurality of storage sections 10S provided in the storage rack 10 are divided into a plurality (six in the present example) of zones CH.

Figure 3:
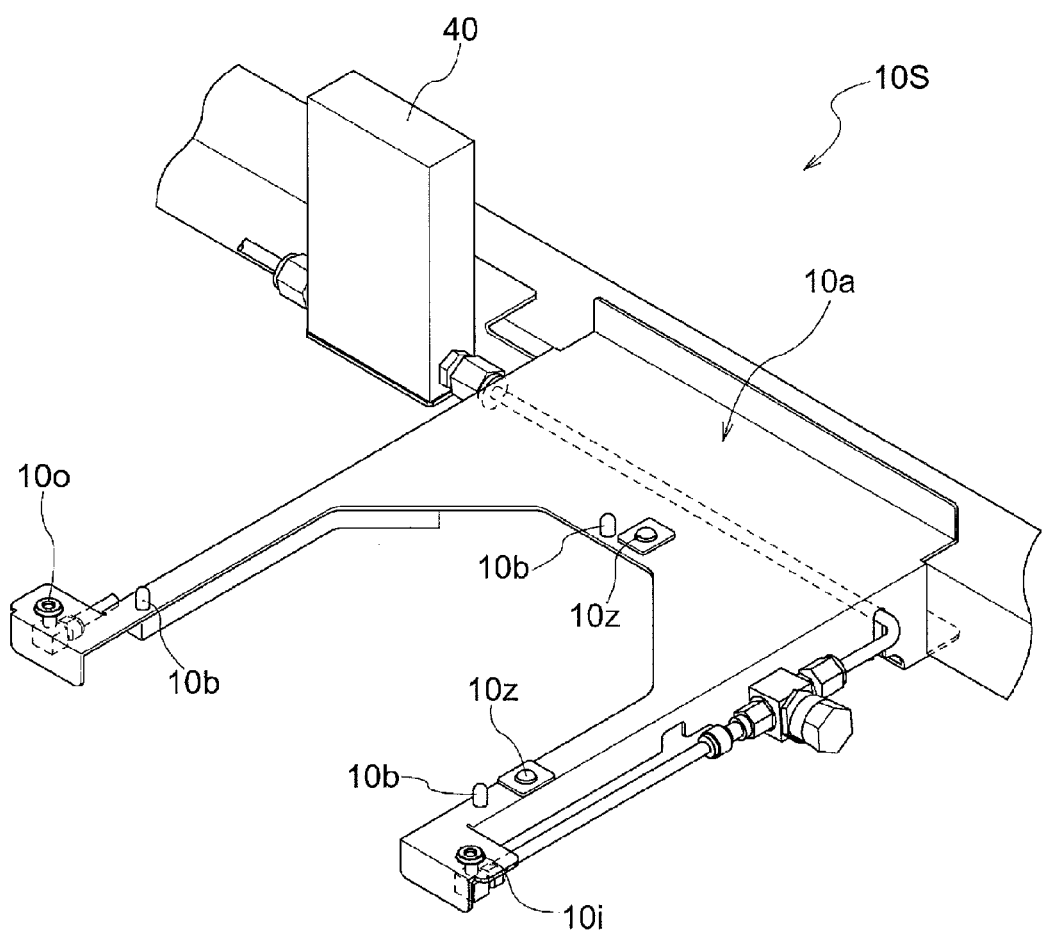
FIG. 3 is a perspective view of a storage section.

As shown in FIG. 3, each of the plurality of storage sections 10S has a receiving support portion 10a which receives and supports a container 50. And each storage section 10S is configured to store a container 50 with the container 50 received and supported by the receiving support portion 10a.

In addition, the receiving support portion 10a is provided with a plurality (three in the present example) of positioning projections 10b for engaging a plurality (three in the present example) of engaged portions (not shown) formed in the undersurface of each container 50 to properly position the container 50 in a predetermined position, and load presence sensors 10z for detecting whether a container 50 is placed on the receiving support portion 10a (i.e., whether the container 50 is stored in the storage section 10S). Two load presence sensors 10z are provided to each receiving support portion 10a in the present example.

In addition, as shown in FIGS. 3 and 4, the receiving support portion 10a is provided with an inject nozzle 10i which functions as an inject portion for supplying nitrogen gas into the interior of the container 50 stored in the storage section 10S, and a discharging gas passage body 10o for allowing passage of the gas to be discharged from the interior of the container 50.

As shown in FIG. 4, the inject nozzle 10i is provided at a location at which the gas supply opening 50i provided to the undersurface portion of the container 50 fits into the inject nozzle 10i when the container 50 is placed at the predetermined position on the receiving support portion 10a. And the discharging gas passage body 10o is provided at a location at which the discharge opening 50o provided to the undersurface portion of the container 50 fits into the discharging gas passage body 10o when the container 50 is placed at the predetermined position on the receiving support portion 10a.

In other words, when the container 50 is stored in the storage section 10S and placed on the receiving support portion 10a, the container 50 is properly positioned in a predetermined position in the horizontal direction by the positioning projections 10b, and the inject nozzle 10i fits into and is connected to the gas supply opening 50i whereas the discharging gas passage body 10o fits into and is connected to the discharge opening 50o.

And with the container 50 received and supported by the receiving support portion 10a, nitrogen gas is injected into the interior of the container 50 through the gas supply opening 50i of the container 50 by causing the nitrogen gas to be injected from the inject nozzle 10i at a pressure greater than or equal to a set value which is greater than the atmospheric pressure, so that the gas in the container 50 is caused to be discharged, or removed, to the outside through the discharge opening 50o of the container 50.

(Structure for Supplying Nitrogen Gas)

As shown in FIGS. 5-8, the article storage facility has a nitrogen gas supply passage 60 which function as the inactive gas supply passage for supplying nitrogen gas to the plurality of storage sections 10S. And this nitrogen gas supply passage 60 is provided only to one of the pair of storage racks 10, and supply nitrogen gas only to that storage rack 10. The nitrogen gas supply passage 60 is described next. The nitrogen gas supply passage 60 includes a base gas supply portion 61 connected to a supply source of nitrogen gas (not shown), zone gas supply portions 62 each of which breaks off, or branches off from the base gas supply portion 61 to the corresponding zone CH, storage section gas supply portions 63 which further break off, or branch off from each zone gas supply portion 62 to respective ones of the storage sections 10S.

Figure 6:
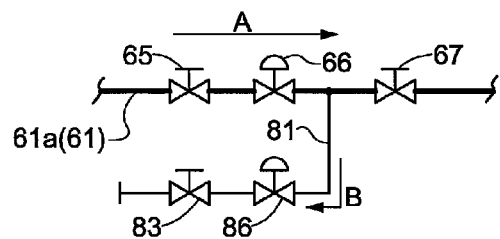
FIG. 6 shows a base gas supply portion and the base portion relief passage.
Figure 7:
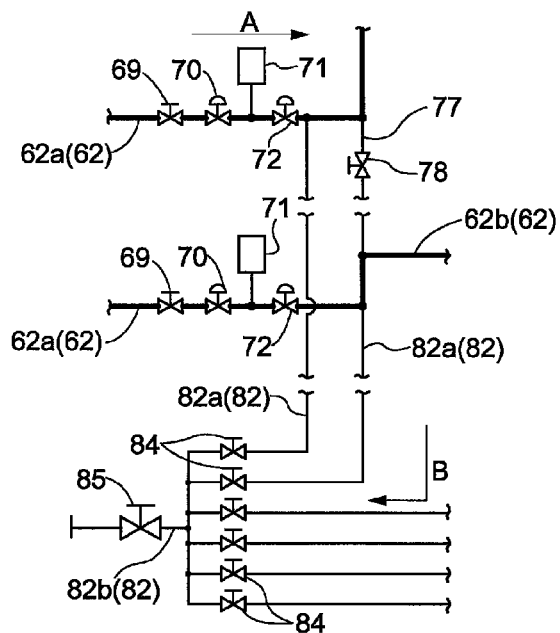
FIG. 7 shows a zone gas supply portion and a zone relief passage.
Figure 8:
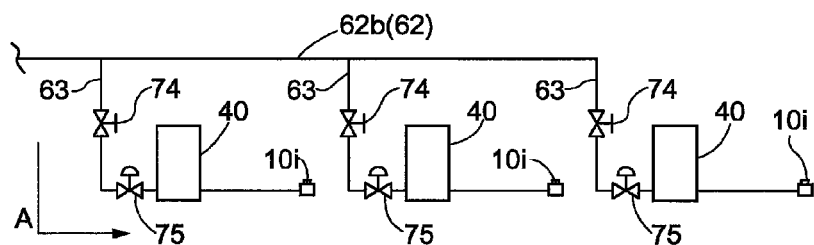
FIG. 8 shows a storage section gas supply portion.

Incidentally, FIG. 5 shows the arrangement for supplying nitrogen gas to each zone CH. Each of FIGS. 6-8 shows a portion of the nitrogen gas supply passage 60. Incidentally, in FIGS. 6 and 7, the nitrogen gas supply passage 60 is drawn with thicker lines than lines that are used to draw other bypass passage 77 and nitrogen gas relief passages 80 (base portion relief passage 81 and zone relief passage 82).

Note that, in describing the nitrogen gas supply passages 60, the direction in which nitrogen gas passes, or flows, toward the inject nozzle 10i from the supply source is referred to as the gas supplying direction, and the description is given using the terms, upstream and downstream, with respect to the gas supplying direction as they are defined in terms of the flow of inactive gas in the gas supplying direction.

(Base Gas Supply Portion)

As shown in FIG. 6, provided in a base installation portion 61a of the base gas supply portion 61 are a first manually operated base portion valve 65, a base portion control valve 66, a second manually operated base portion valve 67 in that order from an upstream side with respect to the gas supplying direction. Incidentally, in the base gas supply portion 61, the direction indicated by the arrow A in FIG. 6 is the gas supplying direction.

Each of the first manually operated base portion valve 65, the base portion control valve 66, and the second manually operated base portion valve 67 are configured to be switched between an open state, or open position, in which the nitrogen gas is allowed to flow from the base gas supply portion 61 to the zone gas supply portions 62 and a closed state, or closed position, in which the gas is not allowed to flow from the base gas supply portion 61 to the zone gas supply portions 62. The base portion control valve 66 is switched to each of the open state and the closed state based on a control command from the controller H. In addition, the first manually operated base portion valve 65 and the second manually operated base portion valve 67 are manually operated by a worker to be switched between the closed state and the open state.

And nitrogen gas is allowed to flow from the base gas supply portion 61 to the zone gas supply portions 62 by switching each of the first manually operated base portion valve 65, the base portion control valve 66, and the second manually operated base portion valve 67 to the open state, whereas nitrogen gas is prevented from flowing from the base gas supply portion 61 to the zone gas supply portions 62 by switching at least one of the first manually operated base portion valve 65, the base portion control valve 66, and the second manually operated base portion valve 67 to the closed state.

(Zone Gas Supply Portion)

As shown in FIG. 5, the zone gas supply portions 62 are connected to the base connecting portion 61b located on the downstream side of the base installation portion 61a of the base gas supply portion 61. To describe in more detail, the nitrogen gas supply passage 60 includes the same number of the zone gas supply portions 62 as the number of the zones CH. And six zone gas supply portions 62 are connected to the base connection portion 61b of the base gas supply portion 61 in the present example. And a zone connecting portion 62b in each of the zone gas supply portions 62 splits into four separate paths or branches, which is the same number as the number of horizontal rows of the storage sections 10S in the zone CH. Incidentally, in the zone gas supply portion 62, the direction indicated in FIG. 7 by the arrow A is the gas supplying direction. Also, the pipes in the zone gas supply portion 62 are of smaller diameter than those used in the base gas supply portion 61.

As shown in FIG. 7, a manually operated zone valve 69, a pressure regulating valve 70, a pressure sensor 71, and a zone control valve 72 are provided, in that order from the upstream side with respect to the gas supplying direction, in each zone installation portion 62a of the zone gas supply portion 62. Note that, in the present embodiment, each manually operated zone valve 69 functions as the first switching valve of the present invention.

The manually operated zone valve 69 and the zone control valve 72 are configured to be switched between an open state or open position in which nitrogen gas is allowed to flow from the zone gas supply portion 62 to the storage section gas supply portions 63, and a closed state or closed position in which nitrogen gas is not allowed to flow from the zone gas supply portion 62 to the storage section gas supply portions 63. Each zone control valve 72 is operated individually to each of the open state and the closed state based on a control command from the controller H. In addition, the manually operated zone valve 69 is manually operated by a worker to be switched between the closed state and the open state.

And the nitrogen gas is allowed to flow from the zone gas supply portion 62 to the storage section gas supply portions 63 by switching each of the manually operated zone valve 69 and the zone control valve 72 to the open state whereas the nitrogen gas is prevented from flowing from the zone gas supply portion 62 to the storage section gas supply portions 63 by switching at least one of the manually operated zone valve 69 and the zone control valve 72 to the closed state.

In addition, the pressure regulating valve 70 adjusts the pressure of nitrogen gas in the storage section gas supply portions 63 by adjusting or regulating the flow rate of the nitrogen gas that flows from the zone gas supply portion 62 to the storage section gas supply portions 63. The pressure sensor 71 detects the pressure of the nitrogen gas in the storage section gas supply portion 63.

(Storage Section Gas Supply Portion)

As shown in FIG. 5, the storage section gas supply portions 63 are connected to a zone connecting portion 62b of the corresponding zone gas supply portion 62. To describe in more detail, the nitrogen gas supply passage 60 include the same number (72 in the present example) of the storage section gas supply portions 63 as the number of the storage sections 10S. And three storage section gas supply portions 63 are connected to any one of the zone connecting portion 62b of the zone gas supply portion 62 in the present example.

Incidentally, the direction indicated in FIG. 8 by the arrow A is the gas supplying direction in each storage section gas supply portion 63. In addition, Also, the pipes in the storage section gas supply portions 63 are of smaller diameter than those used in the zone gas supply portions 62.

As shown in FIG. 8, a manually operated storage section valve 74, a storage section control valve 75, and a mass flow controller 40 are provided, in that order from the upstream side with respect to the gas supplying direction, in each storage section gas supply portion 63. The inject nozzle 10i is connected to the downstream end portion of the storage section gas supply portion 63.

Note that, in the present embodiment, each manually operated storage section valve 74 functions as the second switching valve of the present invention.

The manually operated storage section valve 74 and the storage section control valve 75 are configured to be switched between an open state or open position in which nitrogen gas is allowed to flow from the storage section gas supply portion 63 to the inject nozzle 10i, and a closed state or closed position in which nitrogen gas is prevented from flowing from the storage section gas supply portion 63 to the inject nozzle 10i. Each storage section control valve 75 is operated individually between the open state and the closed state based on a control command from the controller H. In addition, the manually operated storage section valve 74 is manually operated by a worker to be switched between the closed state and the open state.

And the nitrogen gas is allowed to flow from the storage section gas supply portion 63 to the inject nozzle 10i by switching each of the manually operated storage section valve 74 and the storage section control valve 75 to the open state whereas the nitrogen gas is prevented from flowing from the storage section gas supply portion 63 to the inject nozzle 10i by switching at least one of the manually operated storage section valve 74 and the storage section control valves 75 to the closed state.

In addition, each mass flow controller 40 has a function of a flow rate regulating valve which adjusts the flow rate of the nitrogen gas that flows from the storage section gas supply portion 63 to the inject nozzle 10i as well as a function of a flow rate sensor which detects the flow rate of the nitrogen gas that flows from the storage section gas supply portion 63 to the inject nozzle 10i.

Each of the control valves, namely the base portion control valve 66, the zone control valves 72 and the storage section control valves 75, is operated individually between the open state and the closed state based on a control command from the controller H.

In addition, each of the manually operated valves, namely the first manually operated base portion valve 65, the second manually operated base portion valve 67, the manually operated zone valves 69, and the manually operated storage section valves 74 is manually operated by a worker to be switched between the closed state and the open state.

(Control Related Arrangements)

Figure 9:
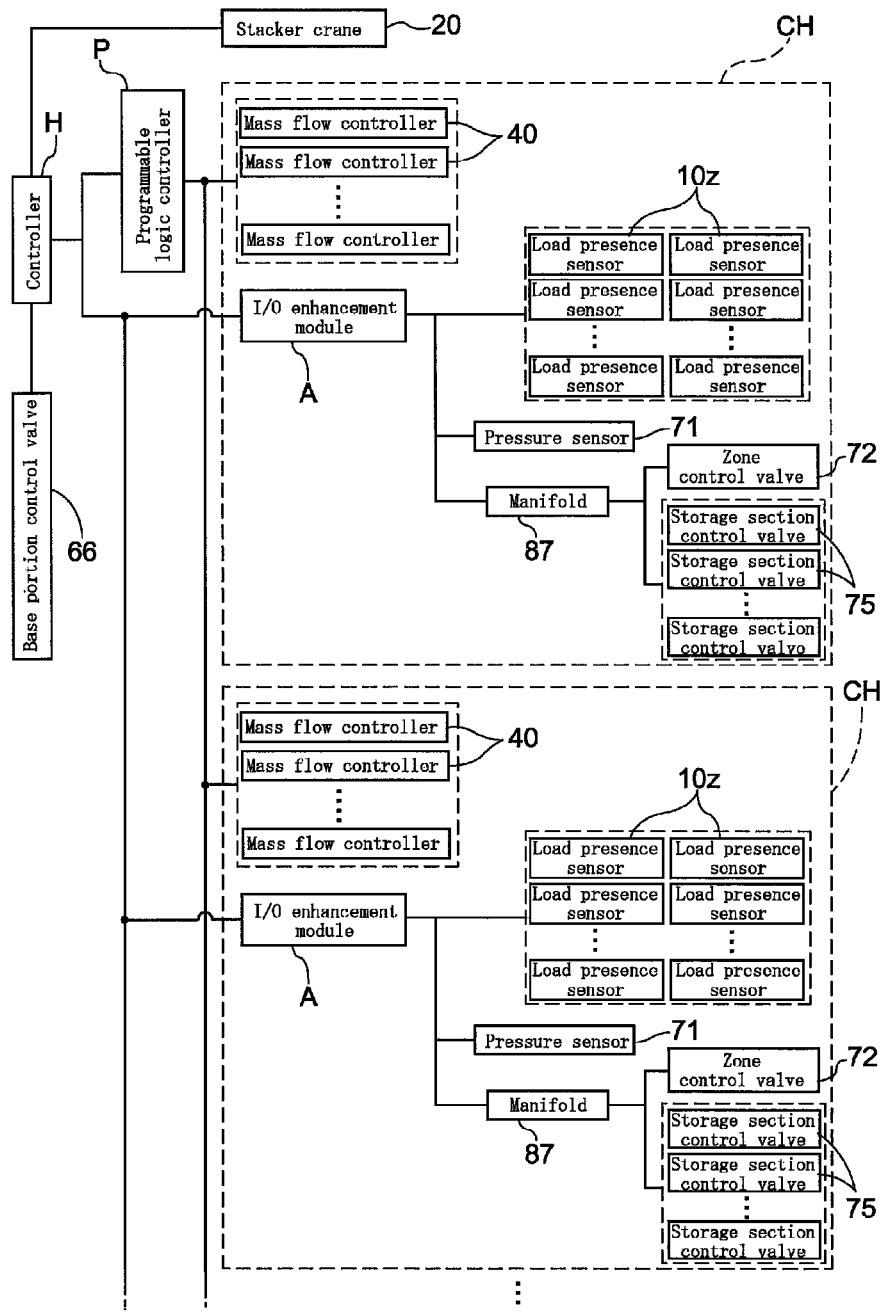
FIG. 9 shows a control block diagram.

As shown in FIG. 9, detected information from the load presence sensors 10z is inputted into the controller H, which is also connected to the stacker crane 20 for mutual communication. This allows the controller H to manage, or keep track of, among other things, the storage status of the containers 50 in the storage rack 10, etc., and also to control operation of the stacker crane 20 based on a carry in command and a carry out command from a superordinate controller (not shown).

To describe in more detail, when the controller H receives a carry in command from the superordinate controller, it performs a carry in transport process. In the carry in transport process, the controller H selects, as the target storage section 10S for storage and based on the storage status, one of the storage sections 10S that is an empty storage section 10S in which no container 50 is stored, and controls operation of the stacker crane 20 to transport a container 50 from the carry in and out conveyor CV to the target storage section 10S. Also, when the controller H receives a carry out command from the superordinate controller, it performs a carry out transport process. In the carry out transport process, the controller H controls operation of the stacker crane 20 to transport a target container 50 to be carried out from the storage section 10S in which the target container 50 is stored, to the carry in and out conveyor CV.

In addition, a programmable logic controller P and a plurality of I/O enhancement modules A are connected the controller H by communication lines for mutual communication. A plurality of mass flow controllers 40 are connected to the programmable logic controller P. Connected to each I/O enhancement module A are the load presence sensors 10z, the pressure sensor 71, and a manifold 87, that belong to the corresponding zone CH.

And the controller H controls the operation of the base portion control valve 66 and transmits, to the programmable logic controller P, supply information which indicates supply amount of nitrogen gas as well as which storage sections 10S to supply nitrogen gas to. The programmable logic controller P controls operations of the mass flow controllers 40 (flow rate regulating valves) based on the supply information from the controller H and transmits command information to each manifold 87 through corresponding I/O enhancement module A. Each manifold 87 operates based on the command information, and operates the zone control valve 72 and the storage section control valves 75 to supply nitrogen gas to the storage sections 10S that are targets of nitrogen gas supply.

Thus, the controller H controls operations of the base portion control valve 66, the zone control valves 72, the storage section control valves 75, and the mass flow controllers 40 through the programmable logic controller P, and the I/O enhancement modules A, etc.

(Bypass Passage)

As shown in FIG. 5, with the plurality of zone gas supply portions 62 divided into groups with two zone gas supply portions in each group, a bypass passage 77 is provided to allow communication between the two zone gas supply portions 62 in each group.

In the present example, the bypass passage 77 is provided to allow communication between two zone gas supply portions 62 that belong to two zones CH that are next to each other in the vertical direction. And so, three such bypass passages 77 are provided for the six zones CH. Note that the bypass passage 77 is of the same diameter as the pipe in the zone gas supply portion 62.

As shown in FIG. 7, each bypass passage 77 has a manually operated bypass valve 78 which can be switched between an open state or open position in which nitrogen gas is allowed to flow through the bypass passage 77 and a closed state or closed position in which nitrogen gas is prevented from flowing through the bypass passage 77. This manually operated bypass valve 78 is manually operated by a worker to be switched between the closed state and the open state.

(Relief Passage)

As shown in FIG. 5, nitrogen gas relief passages 80 that are connected to the nitrogen gas supply passage 60 for discharging nitrogen gas from the nitrogen gas supply passage 60 are provided. And as shown in FIGS. 5-7, provided as the nitrogen gas relief passages 80 are a base portion relief passage 81 connected to the base gas supply portion 61 for discharging nitrogen gas from the base gas supply portion 61, and zone relief passages 82 connected to the respective ones of the plurality of zone gas supply portions 62 for discharging nitrogen gas from the zone gas supply portions 62. Also, in describing the nitrogen gas relief passages 80, the direction in which the nitrogen gas from the nitrogen gas supply passages 60 passes, or flows, is referred to as the gas discharge direction, and the description is given using the terms, upstream and the downstream, with respect to the gas discharge direction as they are defined in terms of the flow of inactive gas in the gas discharge direction.

(Base Portion Pressure Relief)

As shown in FIG. 6, the base portion relief passage 81 is connected to the base installation portion 61a of the base gas supply portion 61 at a location that is on the downstream side of the position of the first manually operated base portion valve 65 and the position of the base portion control valve 66 in the base installation portion 61a of the base gas supply portion 61 with respect to the gas supplying direction, and that is on the upstream side of the position of the second manually operated base portion valve 67 with respect to the gas supplying direction. Note that the pipe of the base portion relief passage 81 is of the same diameter as those used in the zone gas supply portions 62.

Provided in the base portion relief passage 81 are a relief pressure regulating valve 86, and a manually operated base portion relief valve 83 which can be switched between an open state or open position in which inactive gas is allowed to flow through it, and a closed state or closed position in which inactive gas is prevented from flowing through it, in that order from the upstream side in the gas discharge direction. The relief pressure regulating valve 86 has the same structure as the pressure regulating valve 70. The manually operated base portion relief valve 83 is manually operated by a worker to be switched between the closed state and the open state. Note that, in the present embodiment, the manually operated base portion relief valve 83 functions as the base portion relief switching valve of the present invention.

Thus, all of the nitrogen gas from the supply source (not shown) can be caused to flow to the zone gas supply portions 62 by switching the first manually operated base portion valve 65 and the second manually operated base portion valve 67 to the open state and by switching the manually operated base portion relief valve 83 to the closed state.

In addition, by switching the first manually operated base portion valve 65, the second manually operated base portion valve 67, and the manually operated base portion relief valve 83 to the open state, the nitrogen gas from the supply source can be caused to flow to the zone gas supply portions 62 while allowing a part of nitrogen gas from the supply source to flow to the base portion relief passage 81 to cause it to be discharged to the outside, thus making it possible, for example, to take a sample of the nitrogen gas from the supply source.

In addition, by switching the first manually operated base portion valve 65 to the open state, and switching the second manually operated base portion valve 67 to the closed state, and switching the manually operated base portion relief valve 83 to the open state, all of the nitrogen gas from the supply source can be caused to flow to the base portion relief passage 81, thus making it possible to cause the nitrogen gas to flow between the supply source and the base gas supply portion 61.

In addition, by switching the first manually operated base portion valve 65 to the closed state, and switching the second manually operated base portion valve 67 and the manually operated base portion relief valve 83 to the open state, nitrogen gas in the base gas supply portion 61 can be caused to flow to the base portion relief passage 81 to perform pressure venting of the base gas supply portion 61.

Incidentally, the direction indicated in FIG. 6 by the arrow B is the gas discharge direction in the base portion relief passage 81.

(Zone Pressure Relief)

As shown in FIG. 7, the zone relief passages 82 include a plurality of zone relief portions 82a (which function as the relief passages of the present invention) which are connected to respective ones of the plurality of zone gas supply portions 62 for discharging nitrogen gas from the zone gas supply portions 62, and a merged relief portion 82b (which functions as the merged relief passage of the present invention) which is connected to each of the plurality of zone relief portions 82a. Note that the pipes of the zone relief passages 82 are of the same diameter as those used in the storage section gas supply portions 63.

The number of the zone relief portions 82a is the same as the number of the zones CH (six in the present example). And a manually operated zone relief valve 84 is provided in each of the zone relief portion 82a. Each manually operated zone relief valve 84 is configured to be manually switched by a worker between an open state or open position in which nitrogen gas is allowed to flow through it and a closed state or open position in which the nitrogen gas is prevented from flowing through it. Note that, in the present embodiment, the manually operated zone relief valve 84 functions as the zone relief switching valve of the present invention.

And each of the plurality of zone relief portions 82a is connected to the zone gas supply portion 62 at a location on the downstream side, with respect to the gas supplying direction, of the position in which the manually operated zone valve 69 in the zone installation portion 62a of the zone gas supply portion 62 is provided. Thus, each zone relief portions 82a is connected to the zone gas supply portion 62 on the downstream side, with respect to the gas supplying direction, of the position in which the manually operated zone valve 69 is provided, and on the upstream side, with respect to the gas supplying direction, of the position in which the manually operated storage section valve 74 is provided.

In addition, the merged relief portion 82b is connected to the plurality of zone relief portions 82a on the downstream side, with respect to the gas discharge direction, of the positions in which the manually operated zone relief valves 84 of respective ones of the plurality of zone relief portions 82a are provided. The merged relief portion 82b is provided with a manually operated merged relief valve 85 which can be manually switched by a worker between an open state or open position in which nitrogen gas is allowed to flow through it, and a closed state or closed position in which nitrogen gas is prevented from flow through it. Note that, in present embodiment, the manually operated merged relief valve 85 functions as the merged relief switching valve of the present invention.

Thus, the nitrogen gas from the base gas supply portion 61 can be caused to be discharged from the inject nozzles 10i by switching the manually operated zone valves 69 and the manually operated storage section valves 74 to the open state.

In addition, by switching, for any given zone, the manually operated zone valve 69 and the manually operated storage section valves 74 to the open state, and switching the corresponding manually operated zone relief valve 84 and the manually operated merged relief valve 85 to the open state, nitrogen gas from the base gas supply portion 61 can be caused to be discharged from the inject nozzles 10i while causing a portion of the nitrogen gas from the base gas supply portion 61 to flow to the zone relief passage 82 to discharge it to the outside, thus, making it possible, for example, to take a sample of the nitrogen gas for any given zone.

In addition, by switching, for any given zone, the manually operated storage section valves 74 to the closed state, and switching the manually operated zone valve 69, the manually operated zone relief valve 84, and the manually operated merged relief valve 85 to the open state, all of the nitrogen gas from the base gas supply portion 61 can be caused to flow to the zone relief passage 82, thus, making it possible to cause the nitrogen gas to flow for any given zone.

In addition, by switching, for any given zone, the manually operated zone valve 69 and the manually operated storage section valves 74 to the closed state, and switching the manually operated zone relief valve 84 and the manually operated merged relief valve 85 to the open state, nitrogen gas in the zone gas supply portion 62 (particularly, a target portion of the zone, that is on the downstream side, with respect to the gas supplying direction, of the position of the corresponding manually operated zone valve 69 and that is on the upstream side, with respect to the gas supplying direction, of the position of the corresponding manually operated storage section valve 74) can be caused to flow to the zone relief passage 82, which makes it possible to perform pressure venting of the zone gas supply portion 62 (i.e., the target portion of the zone).

Incidentally, the direction indicated in FIG. 7 by the arrow B is the gas discharge direction in the zone relief passage 82.

As such, in the article storage facility of the present embodiment, the manually operated zone valve 69 is provided to each of the plurality of zone gas supply portions 62, and the manually operated storage section valve 74 is provided to each of the plurality of storage section gas supply portions 63. In addition, each zone relief passage 82 is connected to the nitrogen gas supply passage 60 on the downstream side of the manually operated zone valve 69 and on the upstream side of the manually operated storage section valve 74 in each nitrogen gas supply passage 60. This arrangement makes it possible to perform pressure venting, to take a sample of nitrogen gas, and to allow nitrogen gas to flow through, for each zone.

ALTERNATIVE EMBODIMENTS (1) In the embodiment described above, each of the first switching valve, the second switching valve, zone relief switching valves, the merged relief switching valve, and base portion relief switching valve is a manual valve configured to be manually operated and switched by a worker; however, one or more or all of these switching valves may be a control valve which is configured to be switched based on a control command from the controller H.

More specifically, for example, the zone relief switching valves and the merged relief switching valve may be control valves. And the facility may be arranged such that, when a worker specifies one or more zones CH and issues a sampling command by means of the control panel, the zone relief switching valves of the specified zones CH and the merged relief switching valve are operated to the open state based on the control command from the controller H, and such that, when a set period elapses or when a sampling end command is issued by means of the control panel, the zone relief switching valves and the merged relief switching valve are operated to the closed state based on the control command from the controller H.

(2) In the embodiment described above, arrangements are made such that the inactive gas discharged from the zone relief passages 82 is discharged from one location by providing a plurality of zone relief portions 82a and a merged relief portion 82b. However, only the plurality of zone relief portions 82a (between the plurality of zone relief portions 82a and the merged relief portion 82b) may be provided so that inactive gas discharged from the zone relief passages 82 is discharged from a separate location for each zone CH.

(3) In the embodiment described above, the base portion relief switching valve, the zone relief switching valves, and the merged relief switching valve are provided outside the walls K. However, one or more or all of these relief switching valves may be provided inside the walls K.

Incidentally, "outside the walls K" may simply mean outside the installation space in which the storage racks 10 and the stacker crane 20 are provided. For example, in a case where the walls K are arranged such as to define two separate space, namely the installation space and second space in which the controller H is provided, then the second space may be considered to be "outside the walls K", and the relief switching valves may be provided in this second space.

Also, when providing a relief switching valve outside the walls K, it is necessary only to provide at least a part of the relief switching valve (more specifically, control portion such as a control lever of the valve which a worker operates) outside the walls K. And it is not necessary to have the entire relief switching valve located outside the walls K.

(4) In the embodiment described above, the second switching valve is provided to each of the plurality of storage section gas supply portions 63. However, a second switching valve may be provided to each of the plurality of zone gas supply portions 62 instead. In this case, each second switching valve may be provided on the downstream side, with respect to the gas supplying direction, of the position in which the first switching valve in the zone gas supply portion 62 is provided and of the position in which the zone relief passage 82 (zone relief portion 82a) is connected to the zone gas supply portion 62.

(5) In the embodiment described above, an example is described in which each container 50 is a FOUP for storing semiconductor substrates; however, the invention is not limited to this arrangement. And, for example, the container 50 may be a reticle container for storing reticles. In addition, nitrogen gas is used as the inactive gas in the embodiment described above. However, various kinds of gas, other than the nitrogen gas, with low reactivity with the stored substrates W, such as gaseous argon etc., may be used as the inactive gas. Incidentally, a broad range of things, such as industrial products, food, medical supplies, etc. may be stored in the containers 50 as articles.

(6) In the embodiment described above, the inactive gas supply passage is provided only to one storage rack 10 between the pair of the storage racks 10 provided in the article storage facility; however, the inactive gas supply passage may be provided to both of the storage racks 10. Incidentally, when the inactive gas supply passage is provided to both of the storage racks 10, the base gas supply portion 61 and the supply source may be provided to each of the storage racks 10. Alternatively, the base gas supply portion 61 and one supply source may be shared between the two storage racks 10.

(7) With respect to these and other arrangements, and structures, the embodiments disclosed in the present specification are provided only as examples in every respect, and the scope of the present invention is not limited by these embodiments. And various suitable changes and modifications can be made without departing from the spirit of the present invention. Therefore, any other embodiment with changes and modifications made without departing from the spirit of the present invention would naturally fall within the scope the present invention.

What is claimed is:

1. An article storage facility comprising:
a plurality of storage sections for storing containers;
an inactive gas supply passage for supplying inactive gas to each of the plurality of storage sections;
inject portions, each of which is configured to inject the inactive gas supplied to an associated one of the storage sections by the inactive gas supply passage into inside an associated one of the containers stored in the associated one of the storage sections;
wherein the plurality of storage sections are divided into a plurality of zones,
wherein the inactive gas supply passage includes a base gas supply portion, a plurality of zone gas supply portions each of which branches off from the base gas supply portion to associated one of the plurality of zones to supply the inactive gas which flows through the base gas supply portion to the associated one of the plurality of zones, a plurality of storage section gas supply portions each of which is branched off from each zone gas supply portion to respective ones of the storage sections and configured to supply the inactive gas which flows through a corresponding zone gas supply portion individually to associated one of the plurality of storage sections that belong to one of the plurality of zones that corresponds to the corresponding zone gas supply portion, and is configured to allow the inactive gas to be injected from associated one of the inject portions,
wherein the article storage facility further comprises:
a first switching valve provided in each of the plurality of zone gas supply portions, and which can be switched between an open state in which the inactive gas is allowed to flow through the first switching valve and a closed state in which the inactive gas is prevented from flowing through the first switching valve;
a second switching valve provided in either (a) each of the plurality of zone gas supply portions, on a downstream side, with respect to a gas supplying direction, of a position in which the first switching valve is provided, or (b) each of the plurality of storage section gas supply portions, wherein the second switching valve can be switched between an open state in which the inactive gas is allowed to flow through the second switching valve and a closed state in which the inactive gas is prevented from flowing through the second switching valve; and a plurality of relief passages connected to respective ones of the plurality of zone gas supply portions for discharging inactive gas from the respective ones of the zone gas supply portions;

wherein each of the plurality of relief passages is connected to the inactive gas supply passage on the downstream side, with respect to the gas supplying direction, of a position in which the first switching valve is provided in the inactive gas supply passage and on the upstream side, with respect to the gas supplying direction, of a position in which the second switching valve is provided, and wherein each of the plurality of relief passages is provided with a zone relief switching valve which can be switched between an open state in which inactive gas is allowed to flow through the zone relief switching valve, and a closed state in which inactive gas is prevented from flowing through the zone relief switching valve.

2. The article storage facility as defined in claim 1, wherein walls are provided to enclose installation space in which the plurality of storage sections are installed, wherein each zone relief switching valve is located outside the walls, and is a manually operated switching valve which can be switched between the open state and the closed state by manual operation.

3. The article storage facility as defined in claim 2, wherein a merged relief passage connected to each of the plurality of relief passages at a location on a downstream side, with respect to a gas discharge direction, of a position in which the zone relief switching valve is provided in each of the plurality of relief passages, wherein a merged relief switching valve is provided in the merged relief passage wherein the merged relief switching valve can be switched by manual operation between an open state in which inactive gas is allowed to flow through the merged relief switching valve and a closed state in which inactive gas is prevented from flowing through the merged relief switching valve, and wherein the merged relief switching valve is located outside the walls.

4. The article storage facility as defined in claim 1, wherein a base portion relief passage which is connected to the base gas supply portion is provided, and wherein the base portion relief passage is provided with a base portion relief switching valve which can be switched between an open state in which inactive gas is allowed to flow through the base portion relief switching valve, and a closed state in which inactive gas is prevented from flowing through the base portion relief switching valve.

5. The article storage facility as defined in claim 1, wherein the plurality of relief passages are directly connected to respective ones of the plurality of zone gas supply portions for discharging inactive gas from the respective ones of the zone gas supply portions.

6. The article storage facility as defined in claim 2, wherein the plurality of relief passages are directly connected to respective ones of the plurality of zone gas supply portions for discharging inactive gas from the respective ones of the zone gas supply portions.

7. The article storage facility as defined in claim 3, wherein the plurality of relief passages are directly connected to respective ones of the plurality of zone gas supply portions for discharging inactive gas from the respective ones of the zone gas supply portions.

8. The article storage facility as defined in claim 4, wherein the plurality of relief passages are directly connected to respective ones of the plurality of zone gas supply portions for discharging inactive gas from the respective ones of the zone gas supply portions.

* * * * *